United States Patent
Ito et al.

(10) Patent No.: US 6,643,303 B2
(45) Date of Patent: Nov. 4, 2003

(54) LASER DRIVE DEVICE, OPTICAL HEAD, AND OPTICAL INFORMATION PROCESSOR

(75) Inventors: Tatsuo Ito, Osaka (JP); Shin-ichi Kadowaki, Sanda (JP); Tomotada Kamei, Neyagawa (JP); Hiroaki Yamamoto, Hyogo (JP); Yoshiaki Komma, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/958,558

(22) PCT Filed: Feb. 7, 2001

(86) PCT No.: PCT/JP01/00848

§ 371 (c)(1),
(2), (4) Date: Jan. 2, 2002

(87) PCT Pub. No.: WO01/59897

PCT Pub. Date: Aug. 16, 2001

(65) Prior Publication Data

US 2003/0095579 A1 May 22, 2003

(30) Foreign Application Priority Data

Feb. 10, 2000 (JP) .......................................... 2000-033636

(51) Int. Cl.[7] .............................. H01S 3/00; H01S 3/13
(52) U.S. Cl. ..................................... 372/38.02; 372/29
(58) Field of Search .......................... 372/38.02, 29.015; 369/44

(56) References Cited

U.S. PATENT DOCUMENTS

| | | | | |
|---|---|---|---|---|
| 4,603,303 A | * | 7/1986 | Matsuno et al. ............... | 330/11 |
| 4,985,896 A | * | 1/1991 | Kimizuka et al. ............. | 372/38 |
| 5,408,483 A | * | 4/1995 | Kasai et al. .................. | 372/31 |
| 5,936,986 A | * | 8/1999 | Cantatore et al. ............. | 372/38 |
| 6,044,048 A | * | 3/2000 | Oinoue et al. ............. | 369/44.23 |
| 6,191,804 B1 | * | 2/2001 | Kitagawa et al. ........... | 347/238 |
| 6,335,909 B1 | * | 1/2002 | Hashimoto ............... | 369/44.29 |
| 6,445,670 B1 | * | 9/2002 | Oshima ..................... | 369/116 |
| 2001/0020670 A1 | * | 9/2001 | Hyoga ........................ | 250/205 |

FOREIGN PATENT DOCUMENTS

| | | |
|---|---|---|
| JP | 63-198387 | 8/1988 |
| JP | 4-176176 | 6/1992 |
| JP | 8-7316 | 1/1996 |
| JP | 8-56031 | 2/1996 |
| JP | 10-190115 | 7/1998 |
| JP | 10-209545 | 8/1998 |
| JP | 10-242502 | 9/1998 |
| JP | 10-335746 | 12/1998 |

* cited by examiner

*Primary Examiner*—Paul Ip
*Assistant Examiner*—Phillip Nguyen
(74) *Attorney, Agent, or Firm*—RatnerPrestia

(57) ABSTRACT

To provide a laser driving apparatus which is inexpensive and has high reliability in spite of using a plurality of light sources, since a multi-wavelength light source is required for treating different kinds of optical disks such as CD, DVD or the like. In a two-wavelength LD apparatus including: a semiconductor laser 1a; a semiconductor laser 1b; and a photo detector 2, optical outputs of the semiconductor lasers 1a, 1b are controlled by APC circuits 6a, 6b on the basis of respective voltage values of variable resistors 4a, 4b connected in series to the photo detector 2. Alternatively, in the two-wavelength LD apparatus including: the semiconductor laser 1a; the semiconductor laser 1b; and the photo detector 2, the optical outputs of the semiconductor 1a, 1b are controlled by the APC circuits 6a, 6b on the basis of respective intermediate potentials of variable resistors 4a, 4b connected in parallel with the photo detector 2.

9 Claims, 12 Drawing Sheets

LASER DRIVE DEVICE, OPTICAL HEAD, AND OPTICAL INFORMATION PROCESSOR

This application is a U.S. National Phase Application of PCT International Application PCT/JP01/00848.

1. Technical Field

The present invention relates to an optical information processing apparatus for recording, reproducing or erasing information on an optical medium or magneto-optical medium such as an optical disk or an optical card, and more particularly an optical head apparatus which emits laser beams having different wavelengths and a laser driving apparatus used in the optical head apparatus.

2. Background Art

An optical memory technology which uses an optical disk having a pit-shaped pattern as a memory medium having a high density and a large capacity is finding extending application in a digital audio-disk, a video disk, a document file disk and a data file and the like.

By the optical memory technology, information is recorded and reproduced on an optical disk with high accuracy and high reliability by way of a finely condensed light beam. Recording and reproducing operations depend only on an optical system used for the optical memory technology.

Basic functions of an optical head apparatus which is a principal part of the optical system are classified roughly into converging for forming a diffraction limited fine spot, focal point control and tracking control for the above described optical system, and pit signal detection. These functions are realized by combination of various kinds of optical systems and photoelectric conversion detecting systems depending on purposes and applications.

On the other hand, an optical disk having a high density and a large capacity which is referred to as DVD has recently been put to practical use and spotlighted as an information medium which permits processing a large amount of information such as animations. The DVD optical disk adopts a smaller pit size on an information recording surface so as to have a recording density higher than that on a compact disk (hereinafter abbreviated as a CD) which is a conventional optical disk. Accordingly, an optical head apparatus which records and reproduces (information on) the DVD optical disk uses a light source and a converging lens having a wavelength and a numerical aperture (hereinafter abbreviated as NA) for determining a spot diameter which are different from those for the CD. For reference, a wavelength of a light source is approximately 0.78 $\mu$m and an NA of a converging lens is 0.45 for the CD, whereas a wavelength of a light source is approximately 0.63 to 0.68 $\mu$m and an NA is approximately 0.6 for the DVD optical disk.

For recording and reproducing (information on) two kinds of optical disks of the CD and the DVD optical disk by one optical information processing apparatus, an optical head apparatus having two optical systems is required. Since a CD-R which has recently been used frequently as a derivative form of the CD permitting additional writing uses a reflecting film on a disk which is optimalized to a wavelength of 0.78 $\mu$m and does not allow information reproduction at the wavelength for the DVD in particular, an optical information processing apparatus which records and reproduces information not only on DVD and CD but also on the CD-R must have two light sources having wavelengths of 0.78 $\mu$m and 0.63 to 0.68 $\mu$m.

From demands for compact and thin configuration and a lower cost of the optical head apparatus, on the other hand, an optical system tends to be used commonly for the CD and DVD, and there are adopted, for example, a system which switches only converging lenses between two kinds for the CD and DVD optical disk and a system which uses also a converging lens commonly while mechanically or optically enlarging only an NA for the DVD optical disk and reducing the NA for the CD.

Furthermore, there has recently been developed a technology which integrates also a light source by forming an infrared laser emitting layer and a red laser emitting layer in a chip of semiconductor laser (for example, LD: laser diode). Furthermore, there has been developed a two-wavelength light source which has two kinds of semiconductor laser chips mounted in a single package.

The above described two light sources will hereinafter be referred to collectively as two-wavelength LDs for convenience. Description will now be made of a driving method for the two-wavelength LD.

FIG. 10 is a block diagram of a conventional LD driving circuit, in which reference numeral 1 denotes a semiconductor laser, reference numeral 2 denotes a photodiode which is a photodetector for monitoring an output from the semi conductor laser. Reference numeral 3 denotes a common terminal, reference numeral 4 denotes a variable resistor, reference numeral 5 denotes an operational amplifier and reference numeral 6 denotes an automatic power control circuit (hereinafter abbreviated as APC circuit).

Description will now be made of operations of the LD driving circuit which is configured as described above. In FIG. 10, the common terminal 3 is maintained at a positive potential with a power source apparatus (not shown). When the APC circuit 6 starts operating, a current is supplied to the semiconductor laser 1 to emit rays from the semiconductor laser 1. When the photodiode 2 receives a portion of the rays emitted from the semiconductor laser 1, a current corresponding to an intensity of the emitted rays is supplied from the common terminal 3 to ground by way of the photodiode 2 and the variable resistor 4, thereby generating a voltage across both ends of the variable resistor 4. The voltage of the variable resistor 4 is detected by the operational amplifier 5 and fed back to the APC circuit 6. The APC circuit 6 controls the current supplied to the semiconductor laser 1 so that the voltage of the variable resistor 4 is a predetermined voltage, thereby maintaining an optical output from the semiconductor laser 1 constant. A resistance value of the variable resistor 4 is adjusted so that the optical output from the semiconductor laser 1 has a desired value.

Though the above described conventional example uses an output monitoring photodetector for a semiconductor laser, a two-wavelength LD which has recently been under development uses only an output monitoring photodetector for two light sources in most cases as shown in FIG. 11.

FIG. 11 is a circuit block diagram of the two-wavelength LD, in which reference numeral 1$a$ denotes a first semiconductor laser and reference numeral 1$b$ denotes a second semiconductor laser. Reference numeral 2 denotes a photodiode which is a photodetector for monitoring outputs from the semiconductor lasers. Reference numeral 3 denotes a common terminal. Due to demands for a low cost and a compact configuration of the light source, the circuit uses only one photodetector 2 and only one output terminal of the photodetector 2. Though 1$a$ and 1$b$ are two semiconductor lasers in FIG. 11, these lasers may be separate light emitting layers of a single laser chip.

When the above described LD driving circuit is used as a circuit for driving such a two-wavelength LD as that shown in FIG. 11, the circuit has such a configuration as that shown in FIG. 12.

FIG. 12 is a block diagram of a circuit for driving the two-wavelength LD, in which members identical to those in FIG. 11 are denoted by identical reference numerals with no description in particular. In FIG. 12, reference numerals 4a and 4b denote variable resistors, reference numerals 5a and 5b denote operational amplifiers, reference numerals 6a and 6b denote APC circuits, and reference numerals 7a and 7b denote electronic switches.

Semiconductor laser driving operations in FIG. 12 will be described briefly. For driving first semiconductor laser 1a, the electronic switch 7a is set in a connected condition, whereas the electronic switch 7b is set in a disconnected condition.

When the first semiconductor laser 1a is allowed by the APC circuit 6a to start emitting rays, a current is supplied to a photodetector 2 by way of the variable resistor 4a by functions of the electronic switches 7a and 7b. Subsequently, the first semiconductor laser 1a can be driven at a desired optical output by adjusting a resistance value of the variable resistor 4a as in the conventional LD driving circuit.

For driving the second semiconductor laser 1b, the electronic switch 7a is set in a disconnected condition, whereas the electronic switch 7b is set in a connected condition. Since a current is supplied to the photodetector 2 by way of the variable resistor 4b, the second semiconductor laser can be glowed at a desired optical output by adjusting a resistance value of the variable resistor 4b. For the above described operations, the APC circuits 6a and 6b as well as the electronic switches 7a and 7b are switched automatically and selectively by a control system (not shown).

However, the above described two-wavelength LD driving circuit has a configuration which requires the electronic switches 7a and 7b, thereby posing a problem to enhance a cost.

Furthermore, the above described two-wavelength LD driving circuits also has a problem that the circuit allows voltage values detected with the operational amplifiers 5a and 5b to be changed due to changes of resistance values which are caused by temperature changes in the connected conditions of the electronic switches 7a and 7b, thereby changing the outputs from the semiconductor lasers 1a and 1b. Accordingly, the two-wavelength LD driving circuit poses a problem to enhances costs and deteriorates temperature characteristics of an optical head apparatus and an optical information processing apparatus which use a two-wavelength LD driven by the two-wavelength LD driving circuit.

DISCLOSURE OF THE INVENTION

The present invention has been achieved to solve the problems described above and has an object to provide a laser driving apparatus which is inexpensive and free from deterioration of characteristics as well as an optical head apparatus and an optical information processing apparatus which use the laser driving apparatus.

One aspect of the present invention is a laser driving apparatus comprising:

n laser light sources L1 to Ln (n is a natural number equal to or larger than 2);

a photodetector of detecting rays emitted from said n laser light sources;

n variable resistors VR1 to VRn connected to said photodetector;

voltage detecting means of detecting n kinds of voltages V1 to Vn related to said variable resistors; and control means of controlling outputs of said laser light sources so that detected corresponding voltage values are predetermined values, and said variable resistors VR1 to VRn are connected in series to one another, the object of the voltage detection is one variable resistor or a serial circuit composed of a plurality of variable resistors connected in series, and the variable resistors or serial circuits always include variable resistors which are different from each other.

Another aspect of the present invention is A laser, driving apparatus comprising:

n laser light sources L1 to Ln (n is a natural number equal to or larger than 2);

a photodetector of detecting rays emitted from said n laser light sources;

n variable resistors VR1 to VRn connected to said photodetector;

voltage detecting means of detecting n kinds of voltages V1 to Vn related to said variable resistors; and control means of controlling outputs of said laser light sources so that detected corresponding voltage values are predetermined values, and said variable resistors VR1 to VRn are connected in parallel with one another and said voltage detecting means detects voltages V1 to Vn of middle potentials of said variable resistors relative to a reference voltage.

Still another aspect of the present invention is a laser driving apparatus comprising:

n laser light sources L1 to Ln (n is a natural number equal to or larger than 2);

a photodetector of detecting rays emitted from said n laser light sources;

n variable resistors VR1 to VRn connected to said photodetector;

voltage detecting means of detecting n kinds of voltages V1 to Vn related to said variable resistors; and control means of controlling an output of said laser light source so that a detected corresponding voltage value is a predetermined value, and said variable resistors VR1 to VRn are connected partially in series to one another and connected partially in parallel with one another, with regard to a group of variable resistors connected in series, the object of the voltage detection is one variable resistor or a serial circuit composed of a plurality of variable resistors connected in series, the variable resistors or the serial circuits always include variable resistors different from each other, and with regard to a group of variable resistors connected in parallel, said voltage detecting means detects voltages of middle potentials of the variable resistors connected in parallel relative to a reference voltage.

Yet still an other aspect of the present invention is the laser driving apparatus wherein said n is two and said variable resistors are connected in series, and said voltage detecting means detects a voltage across both ends of each of said variable resistors.

Still yet another aspect of the present invention is the laser driving apparatus, said n is two and said variable resistors are connected in series, and said voltage detecting means detects a voltage across both ends of one of said variable resistors, detects a voltage across both ends of a serial circuit composed of said both variable resistors and detects voltages across both ends of the variable resistors respectively utilizing detected voltage of these two detected.

A further aspect of the present invention is the laser driving apparatus, said n is two and said variable resistors are connected in series, and said voltage detecting means (1) detects a voltage across both ends of one of said variable resistors which is connected to a reference potential, (2) detects a potential of a terminal of the other variable resistor which is not connected to said one variable resistor relative to said reference potential, and (3) detects a voltage across both ends of said other variable resistor by subtracting said detected voltage across both the ends from said detected potential.

A still further aspect of the present invention is the laser driving: apparatus, said variable resistors are connected in series and one of the variable resistors is connected to a predetermined reference potential, and said voltage detecting means detects a potential of a side of said one of the variable resistors which is not connected to the reference potential relative to the reference potential and a potential of the other variable resistor which is not connected to said one of the variable resistors relative to said reference potential.

A yet further aspect of the present invention is an optical head apparatus, comprising:

the laser driving apparatus;

means of condensing rays emitted from said laser driving apparatus onto an optical information medium; and a photodetector of detecting reflected rays from said optical information medium.

A still yet further aspect of the present invention is an optical information processing apparatus, comprising at least:

a driving mechanism for an optical information medium;

The optical head apparatus;

a focus servo mechanism using a focus error signal and a tracking error signal respectively obtained from said optical head apparatus;

a tacking servo mechanism;

an electric circuit for realizing said servo mechanism; and a power source.

DESCRIPTION OF SYMBOLS

Figure 1:
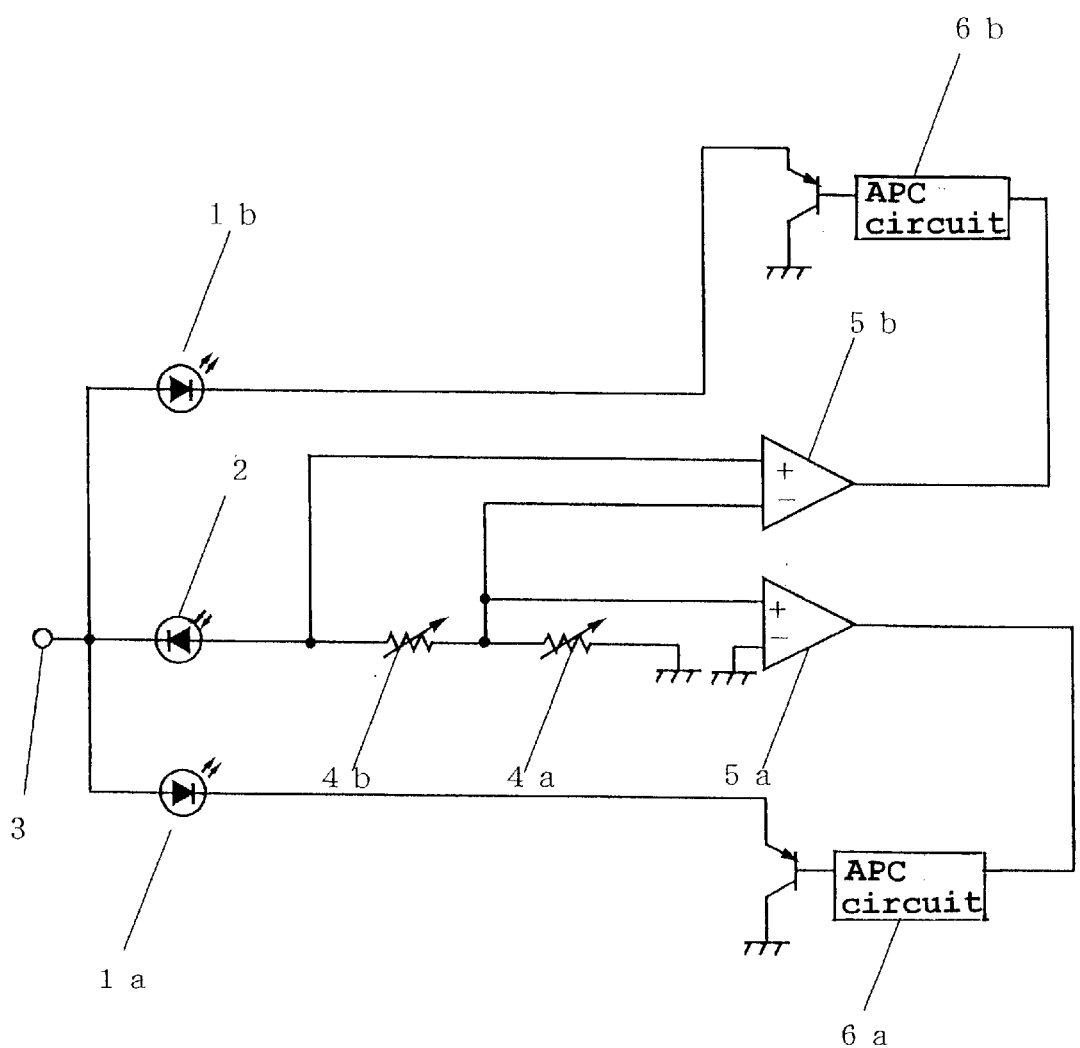
FIG. 1 is a circuit block diagram of an LD driving apparatus according to a first embodiment of the present invention.

1a First semiconductor laser
1b Second semiconductor laser
2 Photodiode
3 Common terminal
4a, 45b Variable resistor
5a, 5b Operational amplifier
6a, 6b APC circuit

BEST MODE FOR CARRYING OUT THE INVENTION

Now, description will be made of preferred embodiments of the present invention with reference to the accompanying drawings.

First Embodiment

Figure 12:
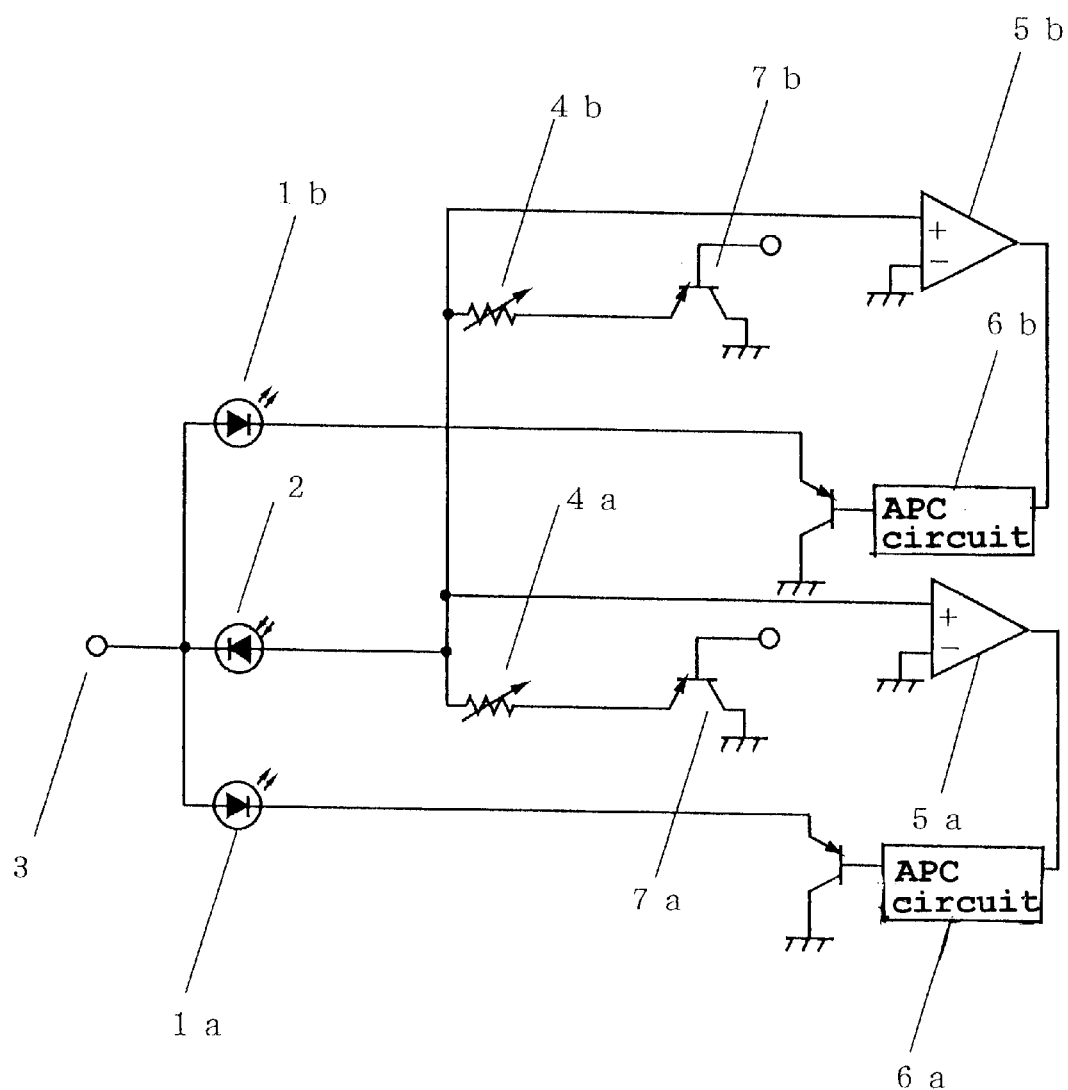
FIG. 12 is a block diagram of a driving circuit for a two-wavelength LD.

FIG. 1 is a circuit block diagram of an LD-driving apparatus according to a first embodiment of the present invention. In FIG. 1, members which are identical to those shown in FIG. 12 are denoted by identical reference numerals with no description in particular. Different from FIG. 12, FIG. 1 shows variable resistors 4a and 4b which are which are connected in series to a photodetector 2, and an operational amplifier 5b which is connected to both ends of the variable resistor 4b. The operational amplifier is an example of voltage detecting means according to the present invention. An operational amplifier is used as voltage detecting means also in embodiments which are described later.

Description will be made of operations of the two-wavelength LD driving apparatus according to the first embodiment of the present invention which is configured as described above.

When a first semiconductor laser 1a is glowed by an APC circuit 6a which is an example of control means according to the present invention, a current is supplied to the photodetector 2 by way of the variable resistors 4b and 4a. At this time, generated across both ends of each of the variable resistors 4b and 4a are voltages which correspond to resistance values of the variable resistors. The voltage across both the ends of the variable resistor 4a is detected by an operational amplifier 5a and fed back to the APC circuit 6a.

The APC circuit 6a controls a driving current for the first semiconductor laser 1a so that the voltage of the variable resistor 4a is a predetermined voltage. By adjusting a resistance value of the variable resistor 4a in advance, it is possible to glow the first semiconductor laser 1a at a desired optical output.

For driving a second semiconductor laser 1b, a current is supplied to the photodetector 2 by way of the variable resistors 4b and 4a in a manner like that described above when an APC circuit 6b which is an example of the control means according to the present invention starts supplying a current to the second semiconductor laser 1b. At this time, generated across both ends of each of the variable resistors 4b and 4a are voltages corresponding to a resistance values of the variable resistors.

The voltage across both the ends of the variable resistor 4b is detected by the operational amplifier 5b and fed back to the APC circuit 6b. The APC circuit 6b controls a driving current for the second semiconductor laser 1b so that the voltage of the variable resistor 4b is a predetermined voltage. By adjusting a resistance value of the variable resistor 4b in advance, it is possible to glow the second semiconductor laser 1b at a desired optical output.

The LD driving apparatus according to this embodiment is configured to connect variable resistors in series in a number corresponding to a number of semiconductor lasers so that each operational amplifier detects a voltage across both ends of each variable resistor as described above, thereby making it possible to realize inexpensive and stable operations of members except electronic switches.

Though the embodiment is configured to use the two semiconductor lasers, it is needless to say that an optical output of each semiconductor laser can be controlled constant even when three or more (the number of n) semiconductor lasers are used by connecting variable resistors in series in a number corresponding to a number of the semiconductor lasers, detecting a voltage value of each variable resistor and feeding back the voltage value.

Second Embodiment

Figure 2:
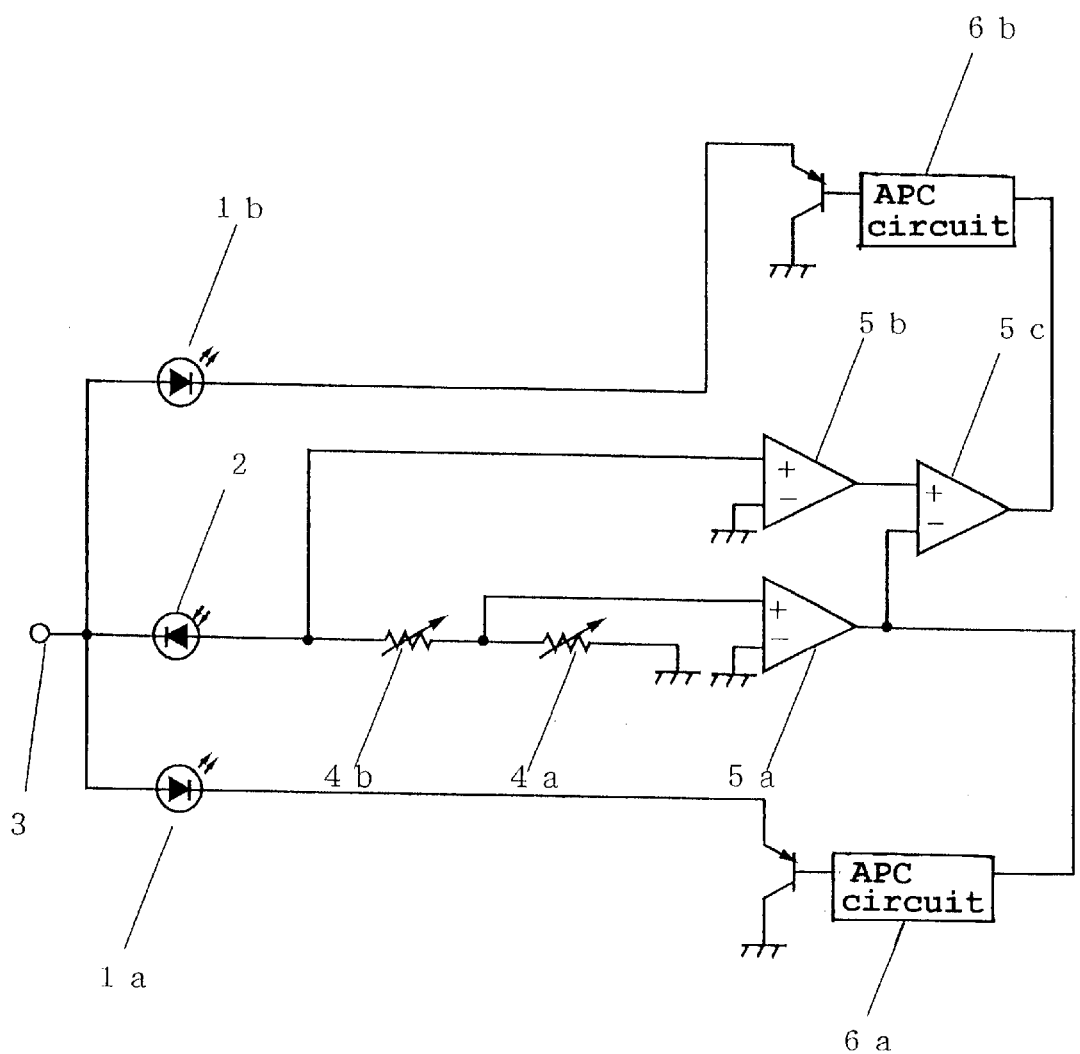
FIG. 2 is a circuit block diagram of an LD driving apparatus according to a second embodiment of the present invention.

FIG. 2 is a circuit block diagram of an LD driving apparatus according to a second embodiment. In FIG. 2, members which are identical to those shown in FIG. 1 are denoted by identical reference numerals with no description in particular. Reference numeral 5c denotes an operational amplifier.

In a configuration shown in the drawing, items which are different from those in FIG. 1 are an input of an operational amplifier 5b which is grounded and the operational amplifier 5c which takes a difference between an output from the operational amplifier 5b and that from an operational amplifier 5a, and feeds back the difference to an APC circuit 6b. In the second embodiment, these operational amplifiers compose voltage detecting means according to the present invention.

The two-wavelength LD driving apparatus according to the second embodiment which is configured as described above remains substantially unchanged from the two-wavelength driving apparatus according to the first embodiment in operations for driving semiconductor lasers 1a and 1b, and provides a similar effect, but is differently configured to use the operational amplifiers 5b and 5c as means of detecting a voltage across both ends of a variable resistor 4b.

In this configuration, the input section which is grounded out of inputs of the operational amplifiers 5a and 5b is common in an actual circuit, and input terminals other than that which is grounded of the operational amplifiers 5a and 5b at a first stage as seen from a side of the APC circuit compose two channels in total, whereby the second embodiment makes it possible to reduce a number of terminals of the operational amplifiers as compared with the first embodiment which uses three channels and provides an effect to permit simplifying a configuration of a circuit as a whole.

Third Embodiment

Figure 3:
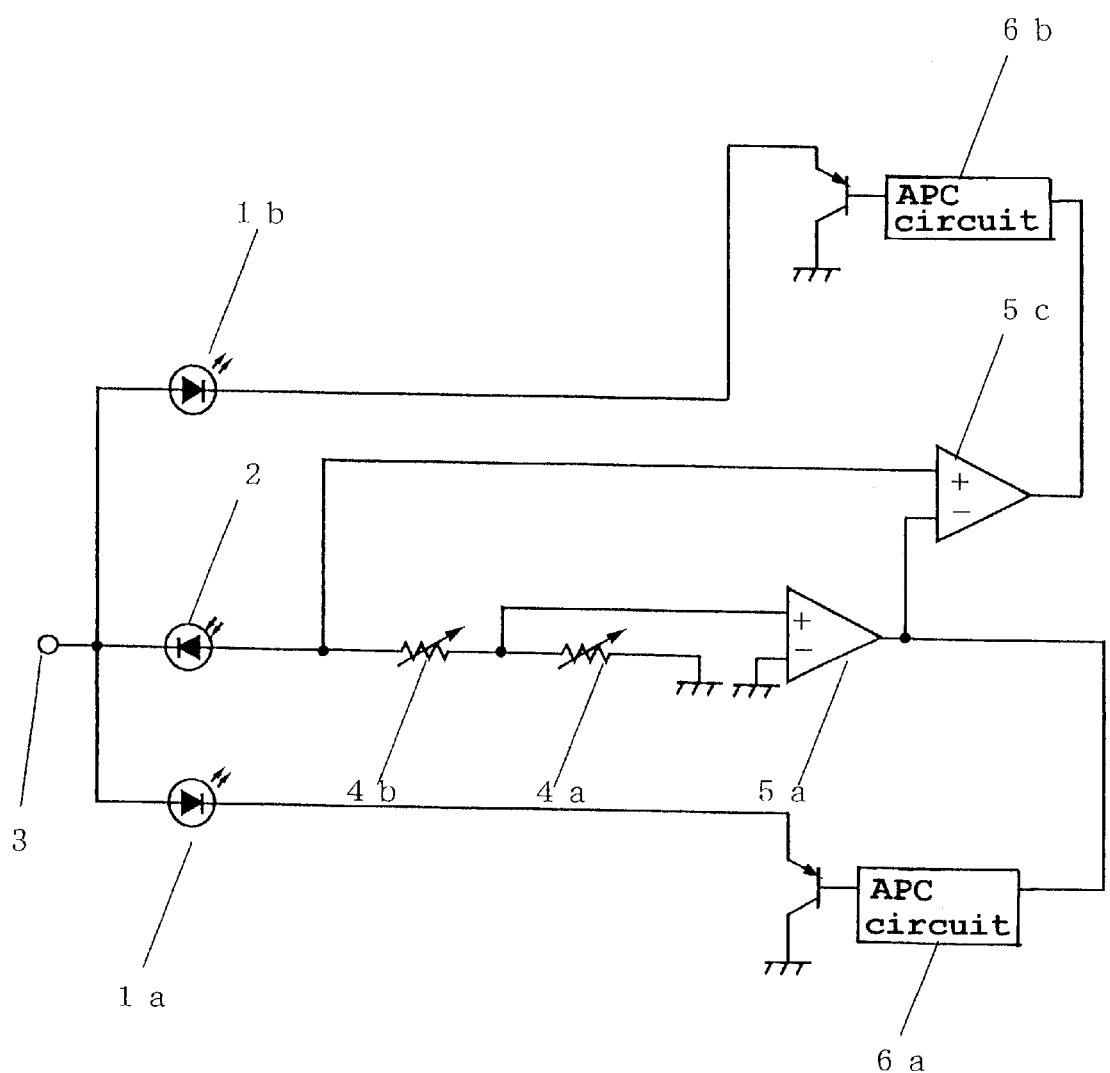
FIG. 3 is a circuit block diagram of an LD driving apparatus according to a third embodiment of the present invention.

FIG. 3 is a circuit block diagram of an LD driving apparatus according to a third embodiment. In FIG. 3, members which are identical to those shown in FIG. 2 denoted by identical reference numerals with no description in particular. Reference numeral 5c denotes an operational amplifier. In a configuration shown in the drawing, an operational amplifier 5b is omitted as an item which is different from the configuration shown in FIG. 2.

In the two-wavelength LD driving apparatus according to the third embodiment which is configured as described above, operations for driving semiconductor lasers 1a and 1b remain substantially unchanged from those in the first embodiment and a similar effect is obtained, but the third embodiment is configured differently in that the operational amplifiers 5a and 5c are used as means of detecting a voltage across both ends of a variable resistor 4b.

Since one of inputs of the operational amplifier 5c is an output of the operational amplifier 5a in this configuration, the third embodiment permits integrating the operational amplifiers 5a and 5c with each other in actual manufacturing, thereby composing a circuit of operational amplifiers in a number smaller than that of the operational amplifiers used in the second embodiment and provides an effect to further simplify a configuration of a circuit as a whole by reducing external terminals.

Fourth Embodiment

Figure 4:
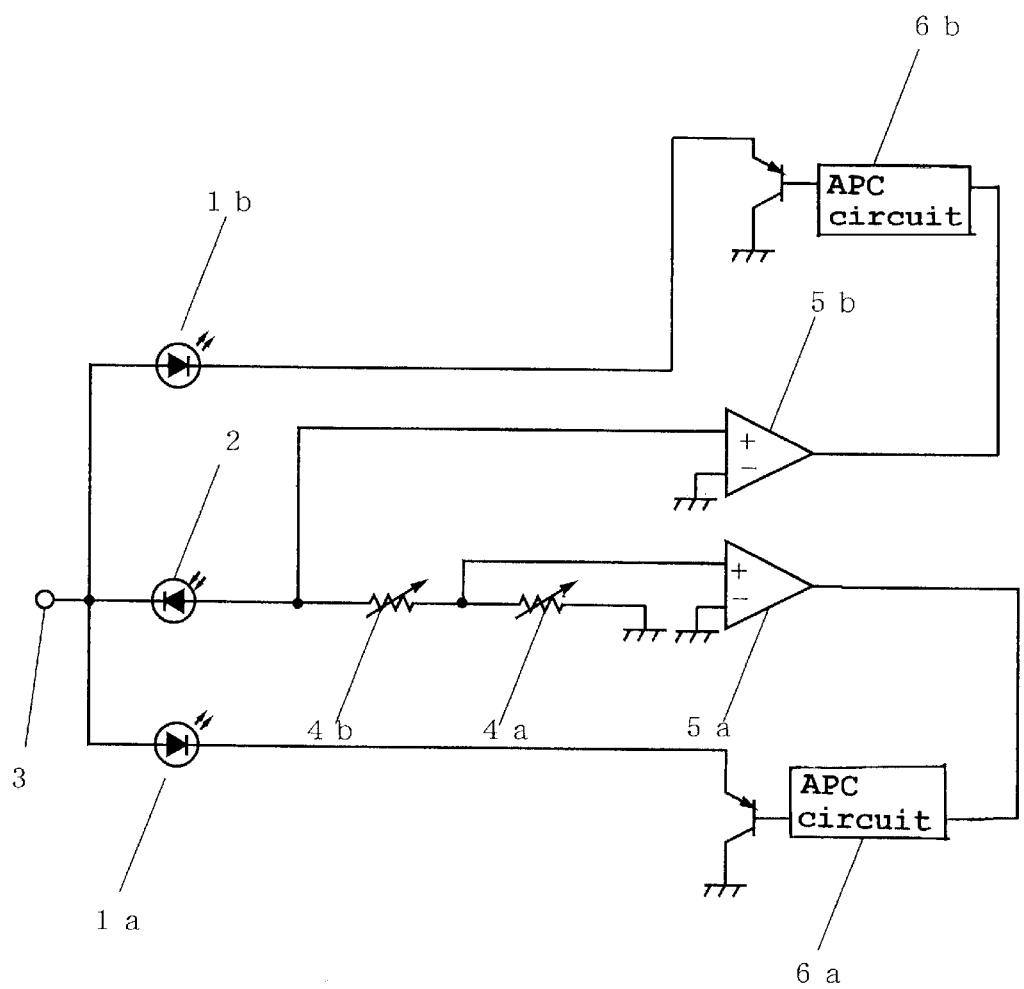
FIG. 4 is a circuit block diagram of an LD driving apparatus according to a fourth embodiment of the present invention.

FIG. 4 is a circuit block diagram of an LD driving apparatus according to a fourth embodiment. In FIG. 4, members which are identical to those in FIG. 2 are denoted by identical reference numerals with no description in particular. Points of a configuration shown in the drawing which are different from that shown in FIG. 2 are that an operational amplifier 5c is omitted and that an output from an operational amplifier 5b is input directly into an APC circuit 6b.

In the two-wavelength LD driving apparatus according to this embodiment which is configured as described above, operations for driving semiconductor lasers 1a and 1b remain substantially unchanged from those in the first embodiment and a similar effect is obtained, but the fourth embodiment is differently configured to use as a voltage to be fed back to the APC circuit 6b a potential difference between a reference potential (a ground potential in the fourth embodiment) and a potential of a variable resistor 4b on a side of a photodetector.

Accordingly, the fourth embodiment is different also in steps of adjusting an optical output from a laser. Specifically, a resistance value of a variable resistor 4a is adjusted by glowing a first semiconductor laser 1a corresponding to a variable resistor 4a set at a potential close to the reference potential and then a resistance value of the variable resistor 4b is adjusted by glowing a second semiconductor laser 1b corresponding to the variable resistor 4b.

This is because a potential difference between the reference potential and the potential on a side of the variable resistor 4b is changed when the variable resistor 4b is adjusted first and then the variable resistor 4a is adjusted.

In addition, a predetermined voltage to be utilized for control in the APC circuit 6b needlessly has a value which is determined taking total resistance of the variable resistors 4a and 4b into consideration.

This configuration provides effects to permit composing a circuit with a small number of operational amplifiers like the third embodiment, simplify a circuit composition by reducing external terminals, and allow a power consumption to be lower than that of the third embodiment by preventing operational amplifiers other than that for a glowing semiconductor laser from being operated since the operational amplifiers 5a and 5b operate independently of each other.

Figure 6A:
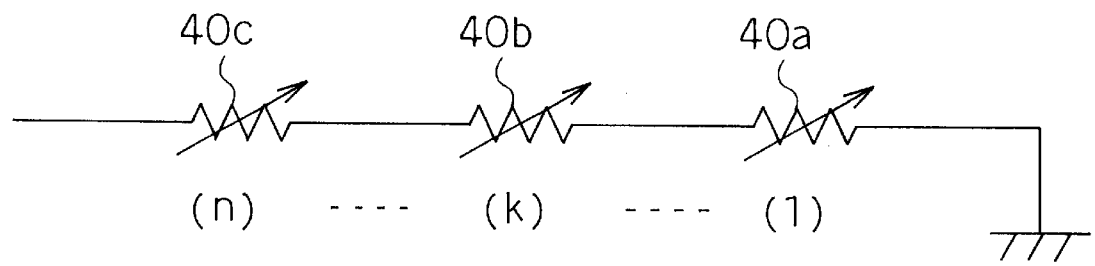
FIG. 6 is a circuit diagram showing various kinds of connection modes for variable resistors according to an embodiment of the present invention.

Be Though the above described first to fourth embodiments are examples in each of which two variable resistors are connected in series, it is needless to say that three or more variable resistors may be connected in series. FIG. 6(a) shows an example in which three variable resistors are connected in series. In this case, voltage which are detected to be utilized for control may be voltages across end of variable resistors 40a, 40b and 40c respectively or other voltages which are described below. That is, when the variable resistors 40a, 40b and 40c are denoted consecutively as first, second and third variable resistors, a first voltage out of three kinds, of voltages is taken as a voltage across both ends of the variable resistor 40a, a second voltage is taken as a voltage across both ends of a serial circuit composed of the variable resistors 40a and 40b, and, a third voltage is taken as a voltage across both ends of the variable resistor 40c.

Alternately, it is possible to take the first voltage out of the three kinds of voltage as the voltage across both the ends of the variable resistor 40a, take the second voltage as the voltage across both the ends of the serial circuit of the variable resistors 40a and 40b, and take the third voltage as a voltage across both ends of a serial circuit composed of the variable resistors 40a, 40b and 40c.

Alternately, it is possible to take the first voltage out of the three kinds of voltages as the voltage across both the ends of the variable resistor 40a, take the second voltage as the voltage across both the ends of the serial circuit of the variable resistors 40a and 40b, and take the third voltage as a voltage as a voltage across both ends of a serial circuit composed of the variable resistors 40b and 40c.

Thus, for detecting a voltage which is to be utilized to control a laser light source, the object of the detection is not limited to one variable resistor but may be a serial circuit composed of a plurality of variable resistors.

When a serial circuit including a variable resistor which has already been adjusted is to be used as an object as described above, however, the serial circuit must include a variable resistor which has not been adjusted yet since the variable resistor which has already been adjusted cannot be changed. The variable resistor which has not been adjusted yet must be adjusted for adjusting an optical output of a laser.

That is, when a plural kinds of voltages are necessary, a serial circuit which is to be an object of detection of k'th (k=1 to n) voltage Vk and composed of a plurality of variable resistors must include at least k'th resistor which has not been adjusted yet in addition to first to k–1'th resistors which have already been adjusted. Ordinal numbers of the k'th and n'th resistors are counted successively from an end of a group of variable resistors which are connected in series.

In short, the variable resistors or the serial circuits must always include variable resistors which are different from each other.

Fifth Embodiment

Figure 5:
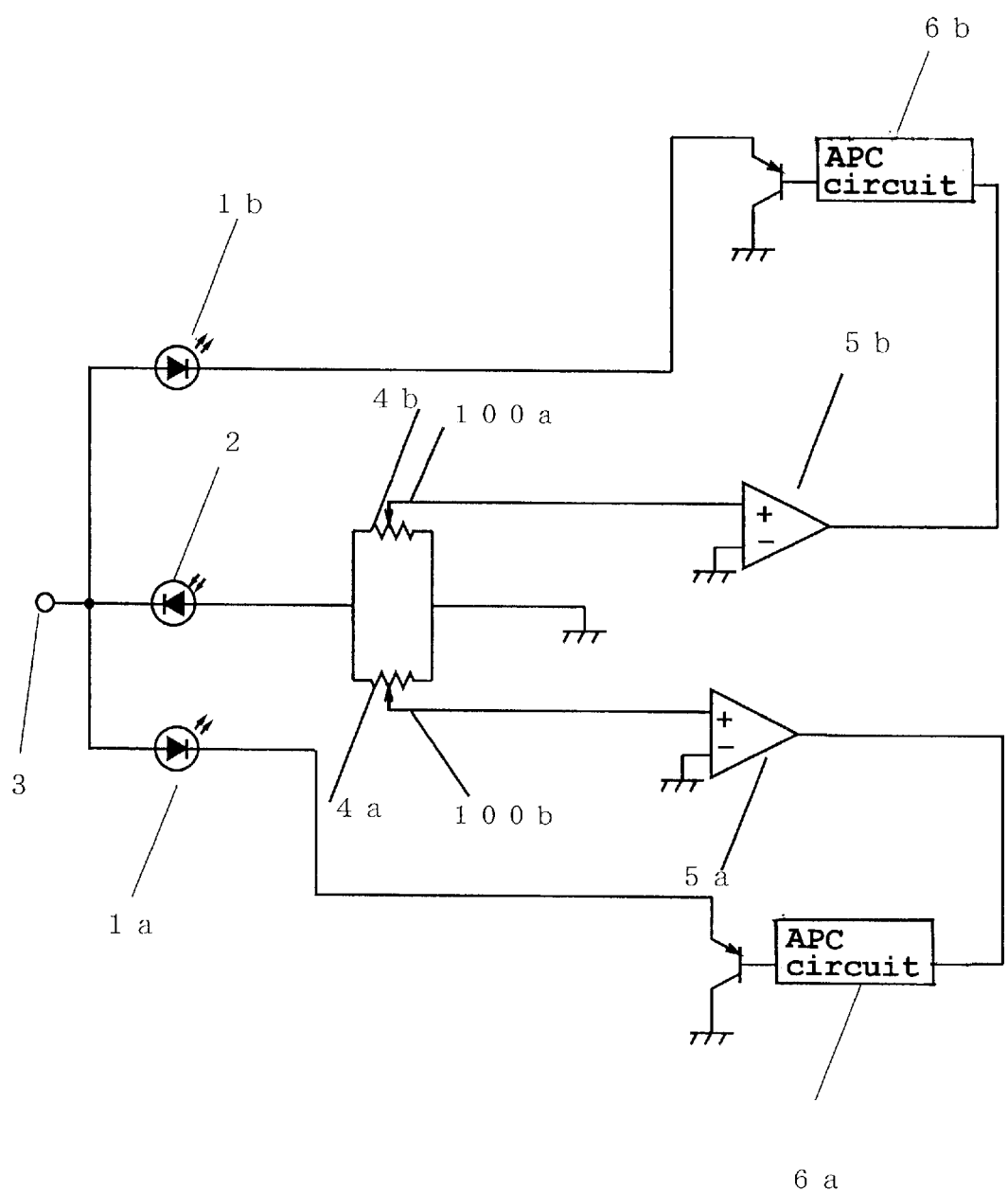
FIG. 5 is a circuit block diagram of an LD driving apparatus according to a fifth embodiment of the present invention.

FIG. 5 is a circuit block diagram of an LD driving apparatus according to a fifth embodiment. In FIG. 5, members which are identical to those shown in FIG. 4 are denoted by identical reference numerals with no description in particular. In FIG. 5, reference numerals 100a and 100b denote sliders of variable resistors 4a and 4b respectively, and potential differences between potentials of the sliders 100a, 100b (hereinafter referred to as middle potentials of the variable resistors 4a, 4b) and a ground potential can be changed by sliding the sliders 100a, 100b along resistor lines.

A configuration shown in the drawing is different from a configuration shown in FIG. 4 in a point that the variable resistors 4a and 4b are connected to a photodetector 2 so that the variable resistors are in parallel with each other, and a point that the middle potentials of the variable resistors 4a and 4b are input into operational amplifiers 5a and 5b.

Description will be made of operations of the LD driving apparatus according to the fifth embodiment of the present invention which is configured as described above.

When a first semiconductor laser 1a is glowed by an APC circuit 6a, a current is supplied to the photodetector 2 by way of the variable resistors 4a and 4b. At this time, a voltage is generated across both ends of the variable resistors 4a and 4b in accordance with a total resistance value of the variable resistors. The middle potential of the variable resistor 4a is detected by the operational amplifier 5a and fed back to an APC circuit 6a.

The APC circuit 6a controls a driving current for the first semiconductor laser 1a so that the middle potential of the variable resistor 4a is a predetermined potential. The first semiconductor laser 1a can be glowed at a desired optical output by adjusting the slider 100a of the variable resistor 4a.

When a second semiconductor laser 1b is to be driven next, an APC circuit 6b starts supplying a current to the second semiconductor laser 1b, whereby a current is supplied to the photodetector 2 by way of the variable resistors 4a, 4b in a manner similar to that described above.

The middle potential of the variable resistor 4b is detected by the operational amplifier 5b and fed back to the APC circuit 6b. The APC circuit 6b controls a driving current for the second semiconductor laser 1b so that the middle potential of the variable resistor 4b is a predetermined potential. The second semiconductor laser 1b can be glowed at a desired optical output by adjusting the slider 100b of the variable resistor 4b.

The LD driving apparatus according to the fifth embodiment is configured to connect variable resistors in parallel with one another in a number corresponding to a number of semiconductor lasers so that individual operational amplifiers detect middle potentials of the variable resistors respectively as described above, thereby making it possible to obtain an effect similar to that of the fourth embodiment.

Though the input to the operational amplifier 5b is higher than that to the operational amplifier 5a and the voltages fed back to the APC circuits 6a and 6b are in an unequal relation in the fourth embodiment, the fifth embodiment does not require taking such an unequal relation into consideration and provides an effect to permit using the APC circuits 6a and 6b which are of an identical kind.

Furthermore, it is needless to say that three or more variable resistors may be connected in parallel with one another.

Figure 6B:
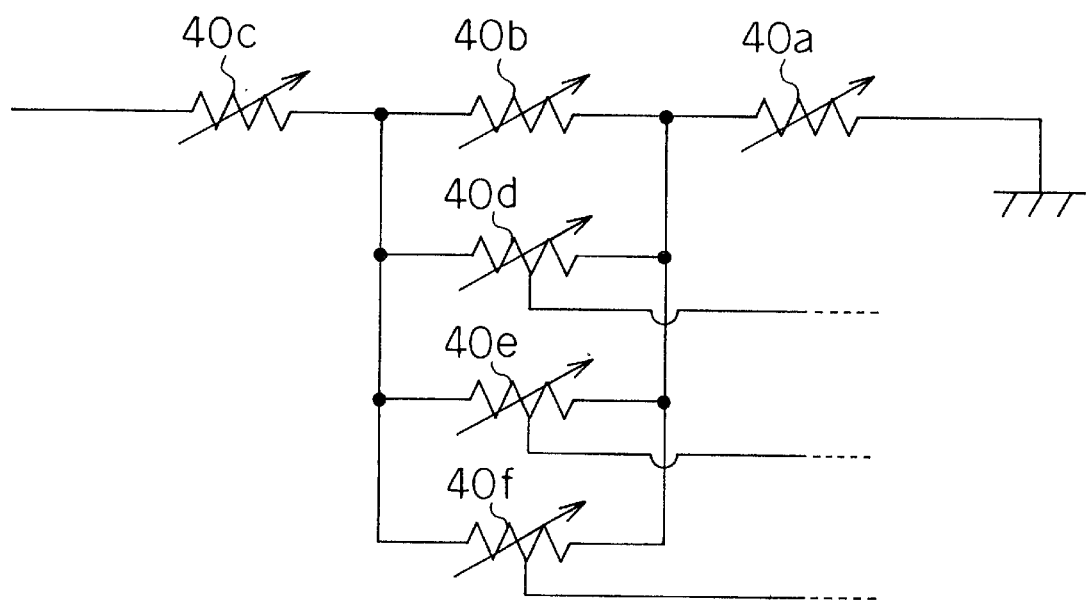

In addition, variable resistors of the LD driving apparatus according to the present invention may consist of a serial circuit portion (40a, 40b and 40c) and a parallel circuit portion (40d, 40e and 40f) which is connected in parallel, for example, with the variable resistor 40b as shown in FIG. 6(b). Though the parallel circuit portion includes 40b strictly speaking, 40b is included herein in the serial circuit portion.

In such a case, description made with reference to the first to fourth embodiment applies to the above described serial circuit portion and description made with reference to the fifth embodiment applies to the above described parallel circuit portion.

Sixth Embodiment

Figure 7:
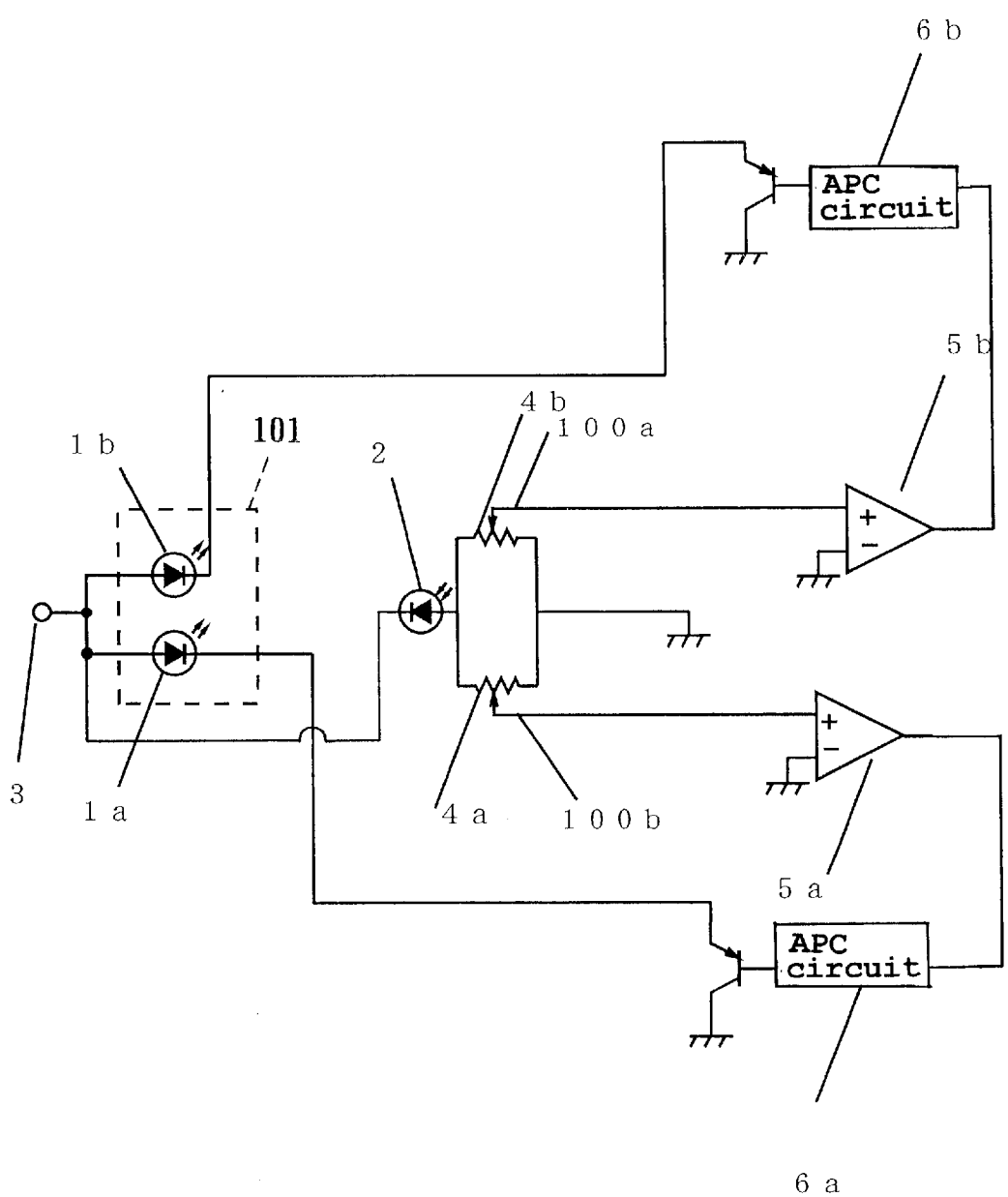
FIG. 7 is a circuit block diagram of an LD driving apparatus according to a sixth embodiment of the present invention.

FIG. 7 shows an LD driving apparatus according to a sixth embodiment. In FIG. 7, members which are identical to those shown in FIG. 5 are denoted by identical reference numerals with no description in particular.

A configuration shown in the drawing is different from that shown in FIG. 5 in a point that semiconductor lasers 1a and 1b are accommodated in a cabinet 101, and in another point that a photodetector 2 is disposed outside the above described cabinet 101 as a separate part.

This is a configuration in case of an apparatus such as a CD-R, CD-RW recording apparatus or a DVD-RAM, DVD-R, DVD-RW recording apparatus which uses the photodetector 2 as a front optical monitor when it is necessary to strictly manage light amounts on disk surfaces.

Though the LD driving apparatus according to the sixth embodiment which is configured as described above remains substantially unchanged in operations to drive the semiconductor lasers 1a and 1b from the LD driving apparatus according to the fifth embodiment, the LD driving apparatus according to the sixth embodiment provides not only an effect to maintain an optical output constant by controlling the current for driving the semiconductor lasers 1a and 1b according to a light amount detected with the photodetector 2 but also an effect to control the optical output by dynamically controlling the APC circuits.

This configuration makes it possible to control light amounts on disk surfaces of lasers respectively with a photodetector, thereby providing an effect to permit reducing a number of parts.

Though variable resistors 4a and 4b are connected in parallel with each other in the sixth embodiment, this method is not limitative and any one of connection modes described with reference to the above described first to fifth embodiments may needlessly be adopted.

Figure 8A:
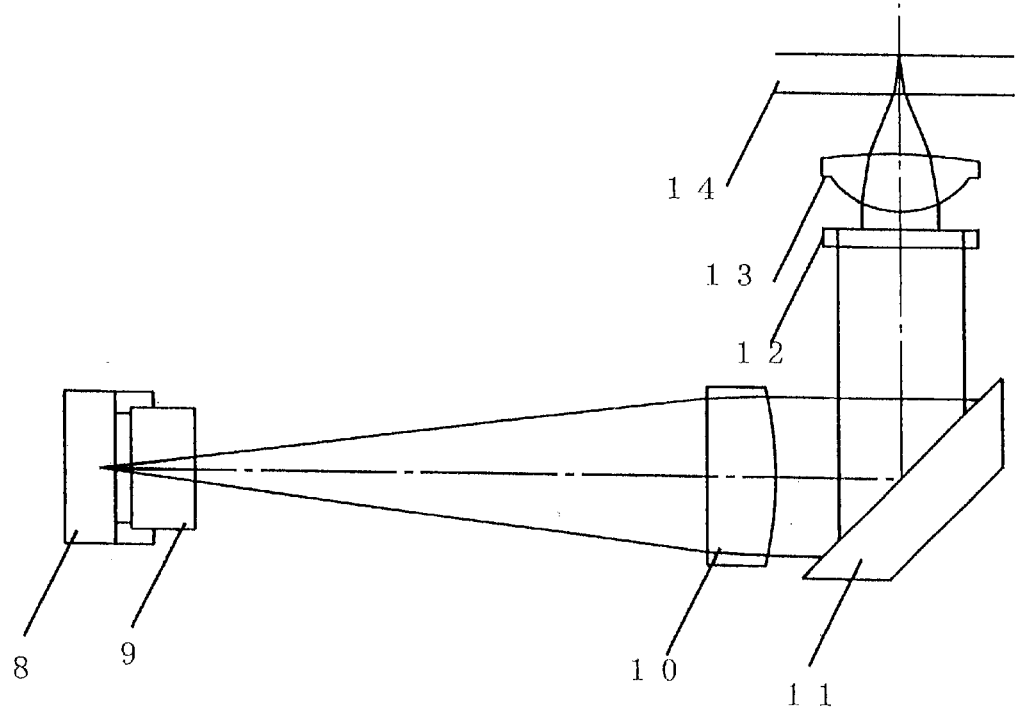
FIG. 8 is configurational diagram of an optical head apparatus according to a seventh embodiment of the present invention.
Figure 8B:
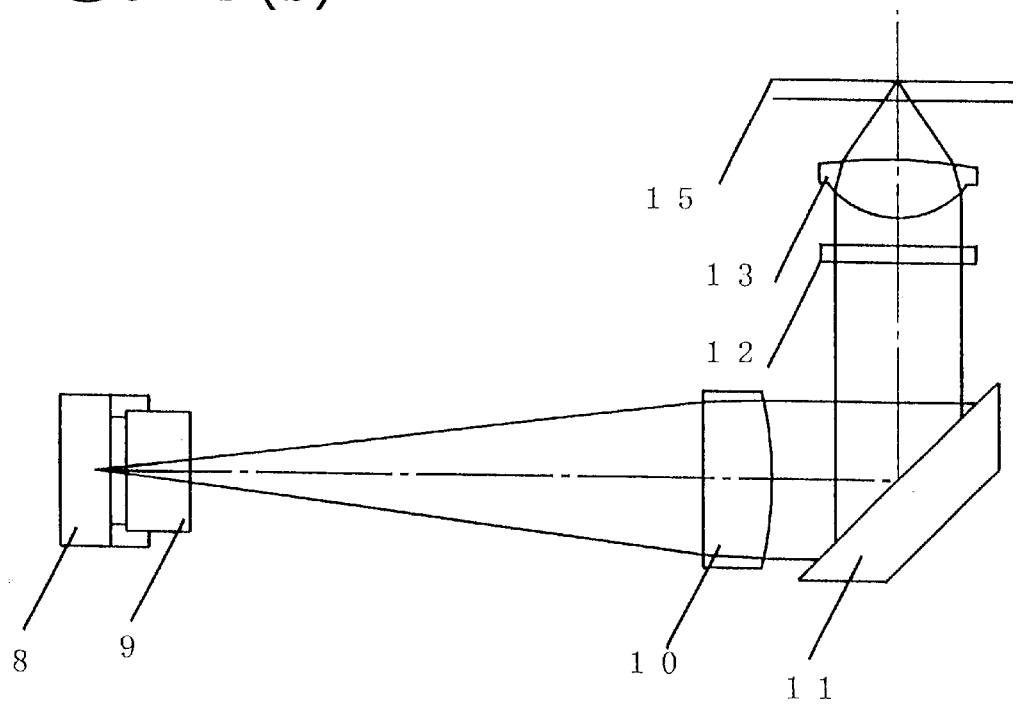

FIGS. 8(a) and 8(b) are diagrams showing a configuration of an optical head apparatus according to a seventh embodiment. In these drawings, reference numeral 8 denotes a two-wavelength light receiving-emitting unit which has a two-wavelength LD, an photodetector for detecting reflected light from an optical information medium and a hologram. Reference numeral 9 denotes the hologram which has a function to lead rays to the above described photodetector by refracting the rays. Reference numeral 10 denotes a condenser lens, reference numeral 11 denotes a bending mirror and reference numeral 12 denotes a wavelength selective aperture which transmits all rays having a wavelength of 0.65 μm and rays having a wavelength of 0.78 μm only within a range of 0.45 in terms of an NA of an objective lens 13. Reference numeral 13 denotes the objective lens, reference numeral 14 denotes a CD optical disk and reference numeral 115 denotes a DVD optical disk.

Furthermore, FIG. 8(a) shows a reproducing condition of a CD where a laser beam which is emitted from the two-wavelength light receiving-emitting unit 8 and has a wavelength of 0.78 μm is transformed by the condenser lens 10 into a parallel beam, led along an optical path bent by the bending mirror 11 and incident on the wavelength selective aperture 12.

The laser beam which is stopped down by the wavelength selective aperture 12 is condensed by the objective lens 13 onto the CD optical disk 14. The laser beam which is reflected by the CD optical disk 14 is returned reversely from the objective lens 13 by way of the bending mirror 11 to the condenser lens 10, diffracted by the hologram 9, and photoelectrically converted and detected as an electric signal by the photodetector of the two-wavelength light receiving-emitting unit 8.

Then, FIG. 8(b) shows a reproducing condition of a DVD where a laser beam which is emitted from the two-wavelength light receiving-emitting unit 8 and has a wavelength of 0.65 μm is transformed by the condenser lens 10 into a parallel beam, led along the optical path bent by the bending mirror 11 and incident on the wavelength selective aperture 12.

The laser beam which has transmitted through the wavelength selective aperture 12 is condensed by the objective lens 13 onto the DVD optical disk 15. The laser beam which is reflected by the DVD optical-disk 15 is returned reversely from the objective lens 13 by way of the bending mirror 11 to the condenser lens 10, diffracted by the hologram 9, and photoelectrically converted and detected as an electric signal by the photodetector of the two-wavelength light receiving-emitting unit 8.

In either case of the CD optical disk and the DVD optical disk, the electric signal which is photoelectrically converted and detected by the photodetector is used as an rf signal in a pit row or a servo signal for tracing a pit row on the optical disk.

Furthermore, a known three-beam method is usable for tracking servo at the CD reproducing time though not shown.

The optical head apparatus according to the seventh embodiment is capable of obtaining a favorable temperature characteristic at a low cost when the optical head apparatus uses the laser driving apparatus according to the embodiment of the present invention.

Eighth Embodiment

Figure 9:
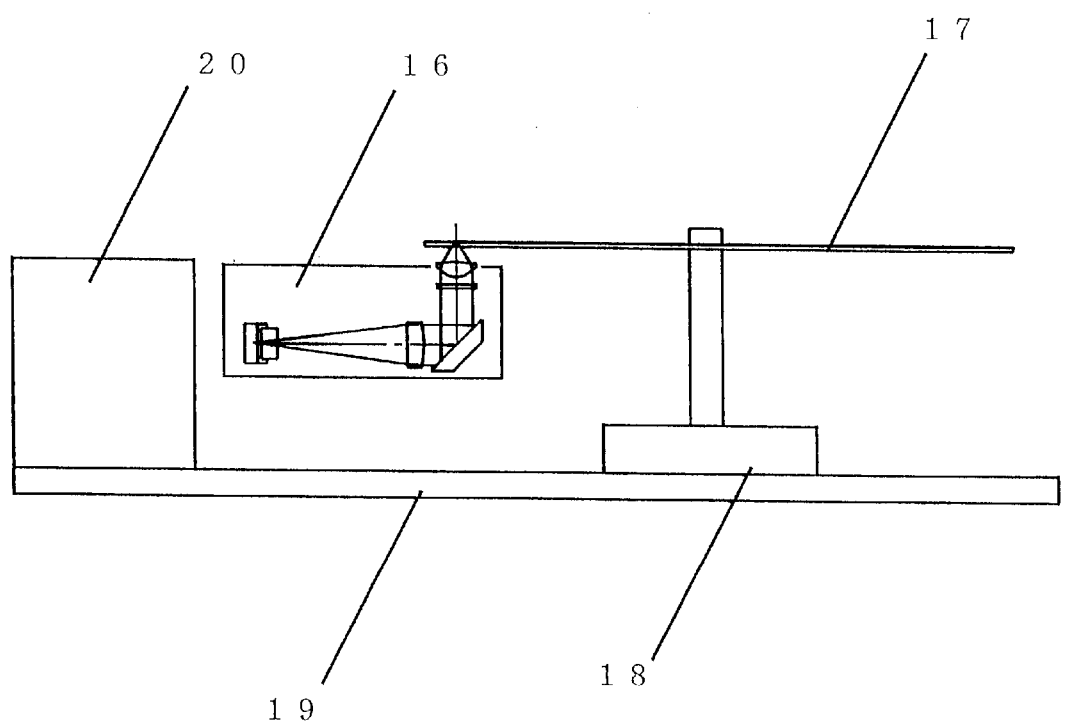
FIG. 9 is a configurational diagram of an optical information processing apparatus according to an eighth embodiment of the present invention.
Figure 10:
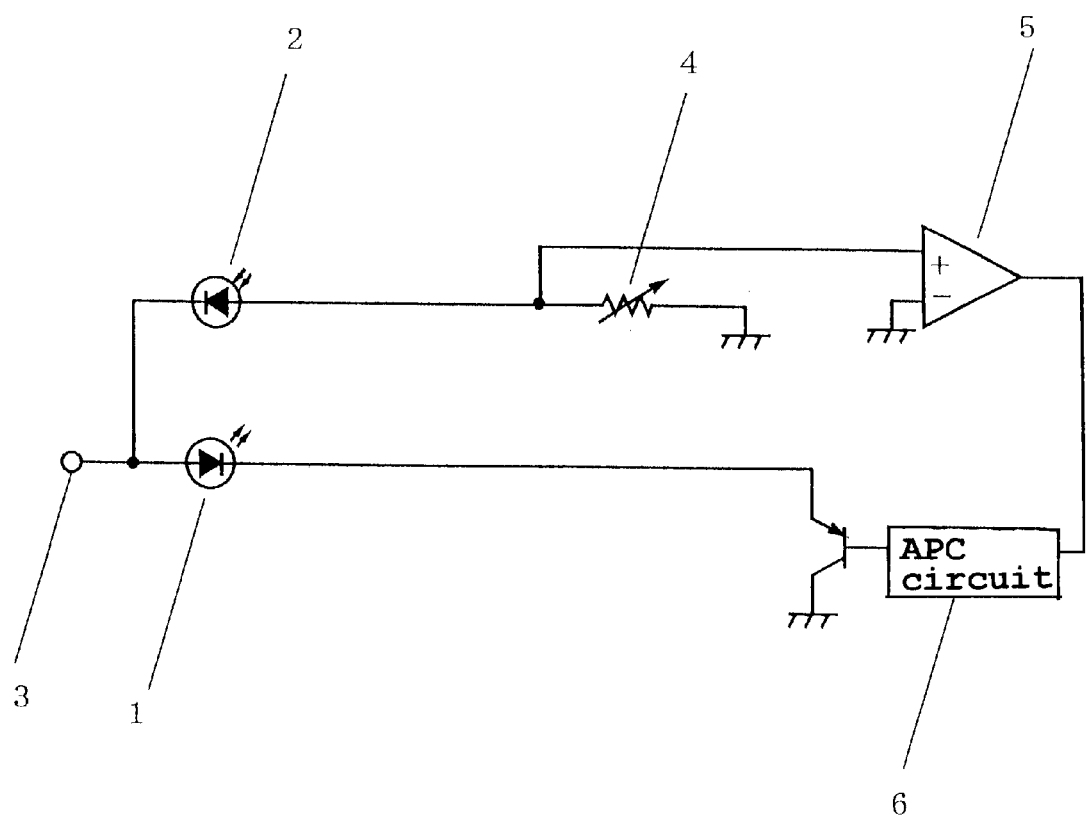
FIG. 10 is a block diagram of a conventional LD driving circuit.
Figure 11:
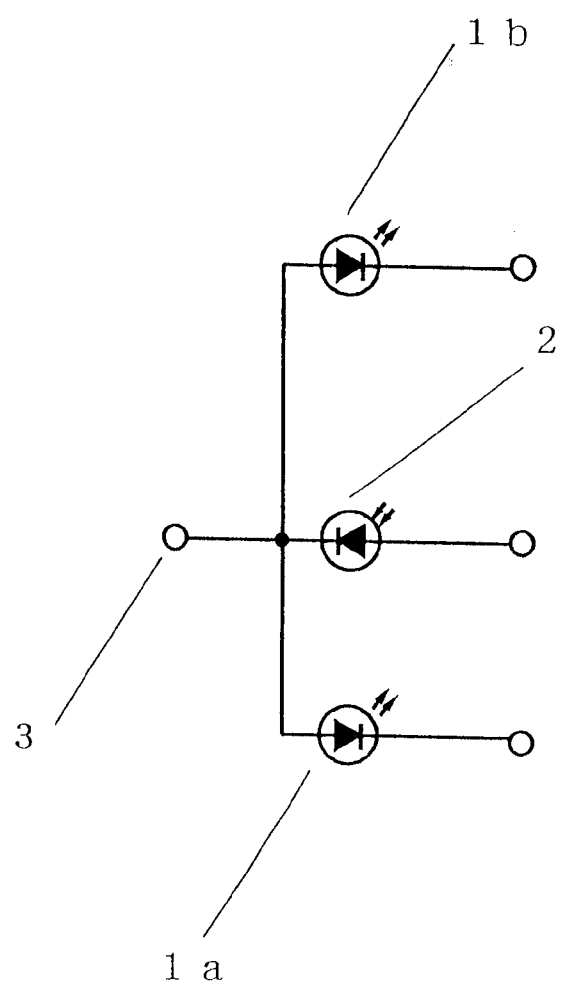
FIG. 11 is a circuit block diagram of a two-wavelength LD.

An optical information processing apparatus according to an eighth embodiment of the present invention will be described using FIG. 9. In FIG. 9, reference numeral 16 denotes the optical head apparatus described with reference to the sixth embodiment, reference numeral 17 denotes an optical disk and reference numeral 18 denotes a motor which supports and rotates the optical disk 17. Reference numeral 19 denotes a circuit board and reference numeral 20 denotes a power source.

The optical information processing apparatus according to the eighth embodiment which has a configuration described above operates as described below. The optical disk 17 is rotated by the motor 18. The optical head apparatus 16 sends to the circuit board 19 a signal which corresponds to a positional relation to the optical disk 17. The circuit board 19 calculates this signal and outputs a signal for slightly moving the optical head apparatus 16 or an objective lens in the optical head apparatus 16. The optical head apparatus 16 or the objective lens in the optical head apparatus 16 performs focus servo and tracking servo for the optical disk 17 with a driving mechanism (not shown), thereby reading, writing or erasing information from or to the optical disk 17. Reference numeral 20 denotes the power source or a connector for an external power source from which electricity is supplied, to the circuit board 19, the driving mechanism for the optical head apparatus, the motor 18 and the driving mechanism for the objective lens.

In addition, no problem is posed by disposing connecting terminals for the power source or the external power source in each driving circuit.

The laser driving apparatus according to the present invention corresponds to the LD driving apparatus in each embodiment, the potential detecting means according to the present invention corresponds to the operational amplifier in each embodiment and the output control means according to the present invention corresponds to the APC circuit in each embodiment.

Though the semiconductor lasers are exemplified in an anode common mode in the embodiments of the present invention, the semiconductor lasers may needlessly be used in a cathode common mode when only a power source is replaced with a ground potential.

INDUSTRIAL APPLICABILITY

The present invention makes it possible to perform automatic power control drive of a plurality of semiconductor lasers with a photodetector and a plurality of variable resistors corresponding to the semiconductor lasers as described above, thereby enabling to obtain a laser driving apparatus which is advantageous from viewpoints of a cost and a temperature characteristic.

Furthermore, the present invention makes it possible to obtain an optical head apparatus which is inexpensive and has a favorable temperature characteristic.

Furthermore, the present invention makes it possible to obtain an optical information processing apparatus which can cope with various optical disk media, and is inexpensive and favorable in a temperature characteristic.

What is claimed is:

1. A laser driving apparatus comprising:
   n laser light sources L1 to Ln in which n is a natural number equal to or larger than 2;
   a photodetector detecting rays emitted from said n laser light sources;
   n variable resistors VR1 to VRn connected to said photodetector;
   a voltage detector detecting n different values of voltages V1 to Vn related to said n variable resistors;
   a controller controlling outputs of said laser light sources so that the detected voltage values are maintained at predetermined values, and
   said n variable resistors VR1 to VRn are connected in series to one another, wherein
      each of the n different values of voltages V1 to Vn detected is a voltage across both ends of one variable resistor within said n variable resistors, or a voltage across both ends of a serial circuit including at least two resistors within said n variable resistors.

2. A laser driving apparatus comprising:
   n laser light sources L1 to Ln in which n is a natural number equal to or larger than 2;
   a photodetector detecting rays emitted from said n laser light sources;
   n variable resistors VR1 to VRn connected to said photodetector;

a voltage detector detecting n kinds of voltages V1 to Vn related to said n variable resistors;
   a controller controlling outputs of said laser light sources so that the detected voltage values are maintained at predetermined values;
   said n variable resistors VR1 to VRn are connected in parallel with one another and
   said voltage detecting means detects voltages V1 to Vn of middle potentials of said n variable resistors relative to a reference voltage.

3. A laser driving apparatus comprising:
   n laser light sources L1 to Ln in which n is a natural number equal to or larger than 2;
   a photodetector detecting rays emitted from said n laser light sources;
   n variable resistors VR1 to VRn connected to said photodetector;
   a voltage detector detecting n kinds of voltages V1 to Vn related to said n variable resistors;
   a controller controlling an output of said laser light sources so that a detected corresponding voltage value has a predetermined value, and
   a group of variable resistors within said n variable resistors are connected in series to one another and another group of variable resistors within said n variable resistors are connected in parallel with one another,
   wherein for the group of variable resistors connected in series, each of different values of voltages detected is a voltage across both ends of one variable resistor within said group of variable resistors connected in series, or a voltage across both ends of a serial circuit including at least two resistors within said n variable resistors, and
   wherein for the other group of variable resistors connected in parallel, said voltage detecting means detects voltages of middle potentials of the variable resistors connected in parallel relative to a reference voltage.

4. The laser driving apparatus according to claim 1, wherein
   said n is two and said n variable resistors are connected in series, and
   said voltage detecting means detects voltages across both ends of each of said n variable resistors.

5. The laser driving apparatus according to claim 1, wherein
   said n is two and said n variable resistors are connected in series, and
   said voltage detecting means detects a voltage across both ends of one of said n variable resistors, and detects a voltage across both ends of
   a serial circuit including said both variable resistors and by utilizing these two detected voltages detects a voltage across both ends of the other one of said n variable resistors.

6. The laser driving apparatus according to claim 1 wherein
   said n is two and said variable resistors are connected in series, and
   said voltage detecting means (1) detects a voltage across both ends of one of said variable resistors which is connected to a reference potential, (2) detects a potential of a terminal of the other variable resistor which is not connected to said one variable resistor relative to said reference potential, and (3) detects a voltage across both ends of said other variable resistor by subtracting said detected voltage across both the ends from said detected potential.

7. The laser driving apparatus according to claim 1, wherein said n is two, said n variable resistors are connected in series and one of the variable resistors is connected to a predetermined reference potential, and said voltage detecting means detects a potential of a side of said one of the n variable resistors, said side not being connected to the reference potential, and said voltage detecting means detects a potential of a side of the other of said n variable resistors, said side not being connected to said one of the n variable resistors.

8. An optical head apparatus, comprising:

the laser driving apparatus according to any one of claims 1 to 7;

means for condensing rays emitted from said laser driving apparatus onto an optical information medium; and a photodetector detecting reflected rays from said optical information medium.

9. An optical information processing apparatus, comprising at least:

a driving mechanism for an optical information medium;

the optical head apparatus according to claim 8;

a focus servo mechanism using a focus error signal and a tracking error signal respectively obtained from said optical head apparatus;

a tracking servo mechanism;

an electric circuit for realizing said servo mechanism; and a power source.

* * * * *

UNITED STATES PATENT AND TRADEMARK OFFICE
CERTIFICATE OF CORRECTION

PATENT NO. : 6,643,303 B2
DATED : November 4, 2003
INVENTOR(S) : Ito et al.

It is certified that error appears in the above-identified patent and that said Letters Patent is hereby corrected as shown below:

Title page,
Item [56], References Cited, insert:
-- OTHER PUBLICATIONS
International Search Report corresponding to application no. PCT/JP01/00848 --

Column 2,
Line 22, after the word "laser" insert the numeral -- 1 --.

Column 5,
Line 24, insert before "said" -- said n is two, --.

Column 9,
Line 13, delete the word "Be".

Column 11,
Line 65, delete the numeral "115" and insert -- 15 --.

Signed and Sealed this

Twenty-fifth Day of May, 2004

JON W. DUDAS
*Acting Director of the United States Patent and Trademark Office*